(12) United States Patent
Seabaugh et al.

(10) Patent No.: US 9,899,480 B2
(45) Date of Patent: Feb. 20, 2018

(54) SINGLE TRANSISTOR RANDOM ACCESS MEMORY USING ION STORAGE IN TWO-DIMENSIONAL CRYSTALS

(71) Applicant: University of Notre Dame du Lac, Notre Dame, IN (US)

(72) Inventors: Alan Seabaugh, South Bend, IN (US); Susan Fullerton, South Bend, IN (US)

(73) Assignee: University of Notre Dame du Lac, South Bend, IN (US)

( * ) Notice: Subject to any disclaimer, the term of this patent is extended or adjusted under 35 U.S.C. 154(b) by 281 days.

(21) Appl. No.: 14/212,310

(22) Filed: Mar. 14, 2014

(65) Prior Publication Data

US 2014/0319452 A1    Oct. 30, 2014

Related U.S. Application Data

(60) Provisional application No. 61/852,318, filed on Mar. 15, 2013.

(51) Int. Cl.
| | |
|---|---|
| *H01L 29/16* | (2006.01) |
| *G11C 13/00* | (2006.01) |
| *H01L 51/00* | (2006.01) |
| *H01L 51/05* | (2006.01) |

(52) U.S. Cl.
CPC ...... *H01L 29/1606* (2013.01); *G11C 13/0014* (2013.01); *G11C 13/0016* (2013.01); *H01L 51/0045* (2013.01); *H01L 51/0554* (2013.01); *G11C 2213/53* (2013.01); *H01L 51/0575* (2013.01)

(58) Field of Classification Search
CPC .......... H01L 29/1606; H01L 29/78684; H01L 2924/0002; H01L 29/66045; H01L 29/7781; H01L 2924/00; H01L 29/2003; H01L 29/66462; H01L 29/7786; H01L 29/205
See application file for complete search history.

(56) References Cited

U.S. PATENT DOCUMENTS

2011/0170330 A1*   7/2011   Oezyilmaz et al. .......... 365/145

* cited by examiner

*Primary Examiner* — Tony Tran
(74) *Attorney, Agent, or Firm* — Greenberg Traurig, LLP

(57) ABSTRACT

A single-transistor random access memory (RAM) cell may be used as universal memory. The single-transistor RAM cell generally includes a first gate, a 2D-crystal channel, a source, a drain, an ion conductor, and a second (back) gate. The single-transistor RAM cell is capable of drifting ions towards the graphene channel. The ions in turn induce charge carriers from the source into the graphene channel. The closer the ions are to the graphene channel, the higher the conductivity of the graphene channel. As the ions are spaced from the graphene channel, the conductivity of the graphene channel is reduced. Thus the presence of the charged ions adjacent to the channel is used to modify the channel's conductivity, which is sensed to indicate the state of the memory.

20 Claims, 4 Drawing Sheets

SINGLE TRANSISTOR RANDOM ACCESS MEMORY USING ION STORAGE IN TWO-DIMENSIONAL CRYSTALS

CROSS REFERENCE TO RELATED APPLICATION

This application is a non-provisional application claiming priority from U.S. Provisional Application Ser. No. 61/852,318, filed Mar. 15, 2013, and incorporated herein by reference in its entirety.

STATEMENT REGARDING FEDERALLY SPONSORED RESEARCH OR DEVELOPMENT

This invention was made with government support under contract number 70NANB7H6168 awarded by the National Institute of Standards and Technology (NIST). The government has certain rights in this invention.

FIELD OF THE DISCLOSURE

The present disclosure relates generally to a universal memory. More particularly, the present disclosure relates to a random access memory cell formed by a transistor incorporating ion storage and a two-dimensional crystal.

BACKGROUND OF RELATED ART

Nonvolatile memory retains stored data even when power is not supplied to the memory. Nonvolatile memory devices are currently widely employed in computers, mobile communication terminals, memory cards, and the like. There are various types of nonvolatile memories, such as, for example, flash memory. Generally, flash memory includes memory cells typically having a stacked gate structure. The stacked gate structure may include a tunnel oxide layer, a floating gate, an inter-gate dielectric layer, and a control gate electrode, which are sequentially stacked on a channel region. Flash memory has its limitations, however, such as relatively low write speed and write/erase degradation.

More recently, new nonvolatile memory devices, such as a resistive random access memory (RRAM), have been proposed. A unit cell of the RRAM typically includes a data storage element that has two terminals and a variable resistive material layer interposed between the two terminals. The variable resistive material layer, commonly referred to as a data storage material layer, has a reversible variable resistance according to whether a low resistive conductive path is formed through the resistive material layer by the electrical signal (voltage or current) applied between the terminals. The applied voltage or current causes the resistive material layer to form microscopic conductive paths called filaments. The filaments appear as a result of various phenomena such as metal ion migration or physical defects. Once a filament forms, it can be broken by the application of a voltage with opposite polarity. The controlled formation and destruction of filaments in large numbers allows for storage of digital data. Resistance changes in the resistive material layer can be sensed to indicate the logic state of the unit cell. While RRAM appears to be a promising nonvolatile memory, there are a number of challenges associated with RRAM. One illustrative challenge is that the distribution cell resistances obtained after writing an RRAM memory array appear to be wide, which results in a less reliable definition of the on and off state. Another limitation concerns scaling of RRAM cells.

Moreover, copper and silver ions are typically used in nanoionic memory because they are stable under atmospheric conditions. One drawback, however, is that these ions are large and slow compared to ions from columns 1A and 1B of the Periodic Table. For example, a high mobility for silver is $10^{-10}$ centimeters squared per volt-second ($cm^2$/Vs) in a silver-germanium-sulfur compound, as described more fully by R. Waser, R. Dittmann, G. Staikov, and K. Szot in "Redox-based resistive switching memories—nanoionic mechanisms, prospects, and challenges," *Adv. Mat.*, vol. 21 (July 2009), which is incorporated herein by reference in its entirety. As a further example, these ions have relatively slow writing pulse widths, as described more fully by M. Tada, T. Sakamoto, K. Okamoto, M. Miyamura, N. Banno, Y. Katoh, S. Ishida, N. Iguchi, N. Sakimura, and H. Hada in "Polymer solid-electrolyte (PSE) switch embedded in 90 nm CMOS with forming-free and 10 nsec programming for low power, nonvolatile programmable logic (NPL)," *IEDM* (2010), which is incorporated herein by reference in its entirety. For instance, copper has a writing pulse width of ten nanoseconds (ns). This in turn limits such devices to low power programmable logic applications.

As the development of RRAM and other memory devices progress, ions are being utilized more frequently to dope transistor channels. For instance, ions can be drifted towards the surface of graphene in a transistor channel to induce sheet carrier densities in graphene as high as $4 \times 10^{14}$ charge carriers per square centimeter (/$cm^2$), for both electrons and holes, as described more fully by D. K. Efetov and P. Kim in "Controlling electron-phonon interactions in graphene at ultrahigh carrier densities," *Phys. Rev. Lett.* 105, 246805 (2010), which is incorporated herein by reference in its entirety. Such high charge carrier densities can be achieved because the ions can get closer to graphene than would otherwise be feasible using a gate dielectric.

DETAILED DESCRIPTION

The following description of example apparatus and methods is not intended to limit the scope of the disclosure to the precise form or forms detailed herein. Instead the following description is intended to be illustrative so that others may follow its teachings.

An example single-transistor random access memory (RAM) cell is disclosed for high-density data storage on two-dimensional (2D) crystals like graphene, for example. It will be appreciated that any 2D crystal or other similar structure may be utilized as desired. In one example, a data storage mechanism is contained within a specialized transistor. The transistor may function as a memory without the need for an added storage capacitor or resistance-change element, allowing for a device of atomic proportions. In one example, the single-transistor RAM cell includes a bit line, a word line, and a write line. Similar to flash memory, the bit line and word line may be used to address the 2D crystal transistor in an array of memory cells. The bit line may connect to the drain of a 2D crystal transistor, and the word line may connect to a first gate. A source associated with the bit line may be connected to a common voltage node.

In some examples, the state of the example single-transistor RAM cell is determined by the resistance of a transistor channel when the transistor is turned on. In some examples, material below the 2D transistor channel is an electrically-insulating ion conductor that has high ionic conductivity and low electronic conductivity. In this instance, the ion conductor is adjacent to a field plate that controls the transport direction for the ions via a back gate that is electrically coupled to the write line. In this way, positively charged ions may be selectively drifted towards the channel by an electric field created by the back gate. The ions can induce electrons in the transistor channel without exchanging electrons, that is, oxidizing or reducing. This behavior is possible with 2D crystals due to the absence of dangling bonds. Put another way, the presence of the charged ions adjacent to the channel is used to modify the channel's conductivity. The change in conductivity is sensed to indicate the state of the memory. The close proximity of ions and induced electrons results in a Coulomb force that holds the ions in place and provides non-volatility. Further, to erase the state of the single-transistor RAM cell, the back gate may in some examples be used to selectively pull the ions back from the 2D crystal channel. The speed of the memory cell for reading and writing is in the nanosecond range, depending in part on the thickness of the ion conductor and the effective mobility of the ion.

Figure 1:
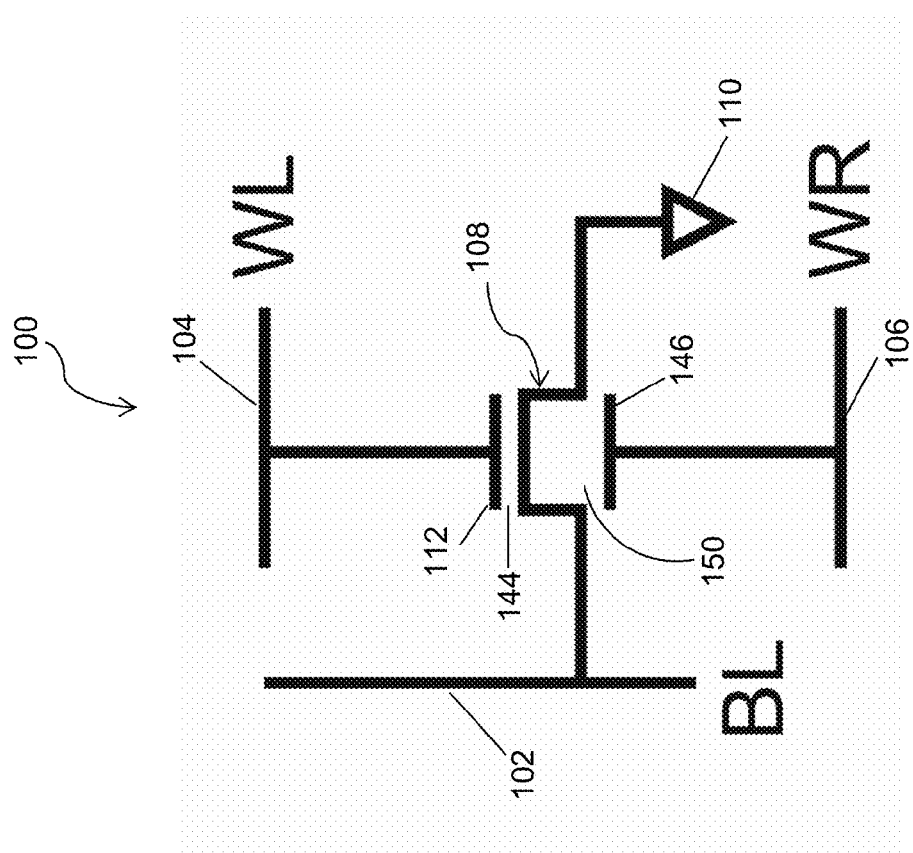
FIG. 1 is a circuit diagram representing an example single-transistor random access memory (RAM) cell constructed in accordance with the present disclosure.

Turning now to the figures, a circuit diagram 100 representing an example single-transistor RAM cell is shown in FIG. 1. In this example, the single-transistor RAM cell generally includes a bit line 102, a word line 104, a write line 106, a channel 108, a drain 110, a top gate 112, an electrically-insulating layer 144, an ion-conducting layer 150, and a back gate 146. It should be understood that the term "layer" can be used interchangeably with "dielectric" in some examples. Moreover, in some respects and unless specified otherwise, the single-transistor RAM cell may operate similar to a transistor, as those having ordinary skill in the art will understand. Thus in terms of components of a transistor, the bit line 102 of the single-transistor RAM cell is connected to the drain 110, the word line 104 is connected to the top gate 112, and the common connection 110 is connected to the source side of the transistor channel 108. As those having ordinary skill in the art will also understand, some of these statements must be taken in context. For instance, the bit line 102 in FIG. 1 would likely be a metal or a graphene wire connecting to the graphene or 2D-crystal channel 108. Similarly, the write line 106 is a metal or graphene wire connecting to the graphene or 2D-crystal back gate 146. The word line 104 can be a metal or graphene wire connecting to the top gate 112. Still further, the write line 106, which is separate from the bit line 102 and the word line 104, may be used to change the state of the channel 108 of the memory cell by moving ions across the ion conductor 150, as disclosed below. The state of the single-transistor RAM cell can be determined by the resistance of the channel 108 when power is supplied to the bit line 102 of the single-transistor RAM cell.

In some examples, a memory cell array comprising a plurality of single-transistor RAM cells utilizes bit lines and word lines to select and read out the state of one or more memory cells in the array. With respect to FIG. 1, the bit line 102 and the word line 104 corresponding to the example single-transistor RAM cell may be used to address the single-transistor RAM cell in an array of single-transistor RAM cells. For example, addressing single-transistor RAM cells may work similar to the process used in flash memory, as those having ordinary skill in the art will understand. In short, the example array is comprised of columns and rows of memory cells in one example. A plurality of bit lines correspond to rows of the example array, while a plurality of word lines correspond to columns of the example array. One example way to "address" a particular memory cell is to supply power to the bit line and the word line that intersect at the particular memory cell. Accordingly, in the example in FIG. 1, addressing the single-transistor RAM cell may involve supplying power to the bit line 102 and the word line 104. Under certain conditions, charge carriers, which may be electrons or holes in some examples, will travel from the bit line 102 into and/or through the channel 108, as permitted by the first gate 112 electrically coupled to the word line 104.

Figure 2:
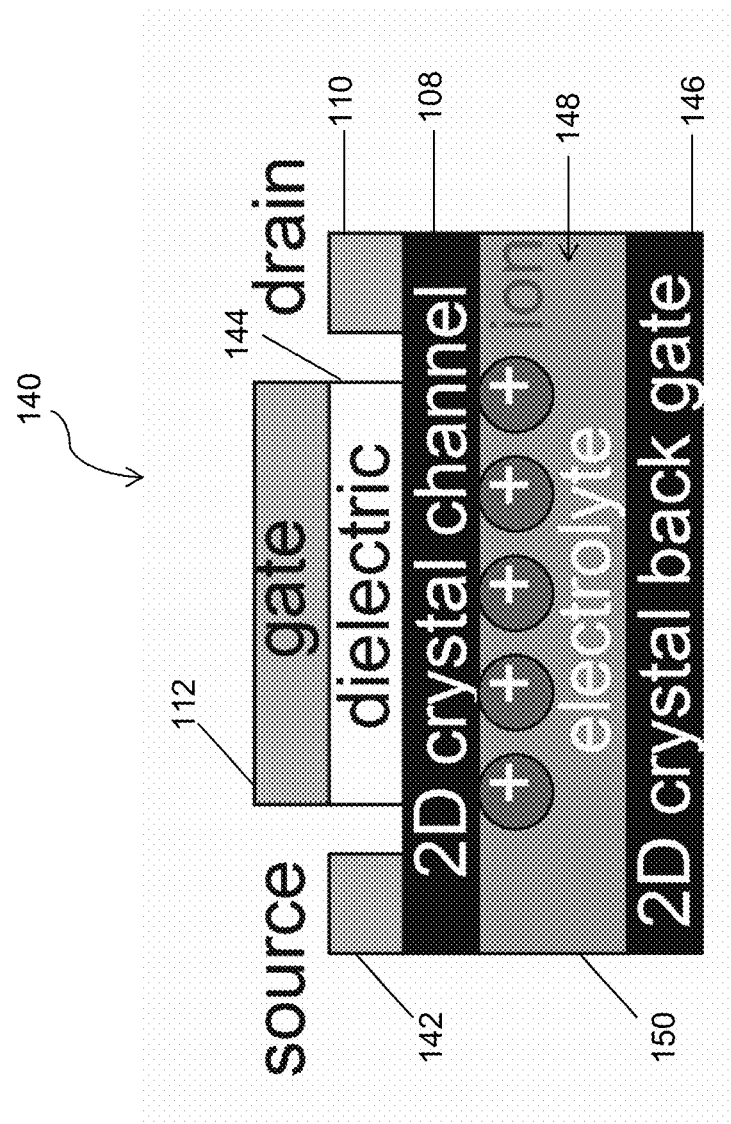
FIG. 2 is a cross-sectional schematic diagram of the example single-transistor RAM cell in the ON state.

With reference now to FIG. 2, a cross-sectional schematic of one example of a single-transistor RAM cell 140 is shown. The example single-transistor RAM cell 140 generally corresponds to the circuit diagram 100 of FIG. 1. In particular, the example single-transistor RAM cell 140 includes a source 142, the drain 110, the channel 108, an electrically-insulating oxide layer 144, the top or "first" gate 112, the back or "second" gate 146, ions 148, and an ion conductor 150. In terms of materials, the ion conductor 150 may in some examples be formed of a crown ether that comprises cobalt crown ether phthalocyanine with binding sites for ionized Li. Moreover, in terms of thickness, the example electrolyte may in some examples have a structure of a single monolayer, a multilayer, or a heterolayer stack. In one example, the ion conductor 150 has high ionic conductivity and low electronic conductivity. In some examples, the ions 148 may be ions such as lithium from column one of the periodic table, with lithium being the lightest solid element, making it ideal for small scale applications. In some examples, the plurality of ions may be comprised of cations, anions, or a mixture of cations and anions. The ions 148 may in some examples be introduced as a salt with both cations and anions. Further, the ions can in one example be introduced as a salt with a counter ion, such as perchlorate. In some examples, the material forming the back gate 146 does not include dangling bonds, and furthermore does not permit the penetration of ions. The back gate 146 can be formed of graphene, another 2D crystalline material, or a metal which does not oxidize or reduce in the presence of the ion.

Also, the electrically-insulating oxide layer 144, which may be formed of aluminum oxide ($Al_2O_3$) in some examples, acts to insulate the channel 108 from the first gate 112. By way of example, the blocking oxide layer 144 may prevent charge carriers from flowing from the channel 108 to the first gate 112. It will be appreciated by one of ordinary skill in the art that the type and/or combination of materials used to form any component of the disclosed single transistor RAM cell may be any suitable material as desired.

Yet further, the channel 108 may be formed from a layered crystal, such as a transition metal dichalcogenide (e.g., $MoS_2$, $MoSe_2$, $MoTe_2$, $WS_2$), graphene, or the like. The term "2D crystal" is used because the crystal is one monolayer thick so that electron transport in the out-of-plane direction is obstructed. 2D crystals such as dichalcogenides have attributes that are highly suited for low-voltage low-power transistors. For example, 2D materials have self-passivated surfaces, near ideal electric-field coupling to the gate, symmetric band structure enabling complementary transistor fabrication, and have atomically-thin dimensions beyond the limits of scaling of any field effect transistor (FET) in conventional (3D) semiconductors such as Si, Ge, or those from Groups III-V. These properties are especially relevant to the formation of steep-subthreshold swing transistors like the tunnel field-effect transistor. In addition, the low mass and mechanical flexibility possible with 2D materials provides new opportunities for autonomous systems, medical diagnostics, and remote sensing, to name but a few examples.

As will be appreciated by those having ordinary skill in the art, a multitude of example methods of producing 2D graphene exist, including, for instance, micromechanical cleavage (also known as "micromechanical exfoliation"); anodic bonding; laser ablation and photoexfoliation; liquid-phase-exfoliation of graphite; growth on silicon carbide (SiC); growth on metals by precipitation; thermal chemical vapor deposition on metals or insulators; plasma-enhanced chemical vapor deposition; molecular beam epitaxy; atomic layer epitaxy; heat-driven conversion of amorphous carbon; chemical synthesis; and in the form of nanoribbons and quantum dots. Once the 2D layer of graphene is prepared, it may be coated with an ion conductor, which in some examples may be a 2D solid polymer electrolyte. The top FET portion of the memory can then be laminated onto the bottom portion.

Power dissipation is often a fundamental problem for nanoelectronic circuits. In some examples, therefore, the channel 108 and an area leading into the channel 108 may be formed from part of a graphene nanoribbon tunnel field-effect transistor (TFET). TFETs are steep devices that achieve their sub-Boltzmann behavior by energy filtering. TFETs require less power than complementary metal-oxide-semiconductor (CMOS) transistors, particularly because TFETs use quantum-mechanical band-to-band tunneling, as opposed to thermal injection, to inject charge carriers into the channel 108. In one example, a width of the graphene nanoribbon is three nanometers (nm).

As disclosed above, because the ion conductor 150 formed of the solid electrolyte has high ion conductivity and low electron conductivity, lithium ions (+), perchlorate ions (−), or other suitable ions may then be drifted through the ion conductor 150 to the graphene surface where they form an electric double layer from a lithium-graphene interface. The electric double layer may in turn induce sheet carrier densities in the graphene channel 108 as high as about $4 \times 10^{14}/cm^2$ for both electrons and holes. Such high densities are achieved because of the high capacitance density induced by the electric double layer at the interface between the ion conductor 150 and the graphene channel 108. In effect, the resistance of the channel 108 is low when the lithium ions are drifted towards the graphene channel 108. Conversely, the resistance of the channel 108 is high when the lithium ions are drifted away from the graphene channel 108.

As also disclosed above, the speed of the ions used in transistor memories can be increased, such as, for example, by a factor of approximately 40,000 by choosing an ion based on Column 1A of the Periodic Table. Lithium, for instance, has a diffusivity of $10^{-6}$ $cm^2/s$ in titanium oxide ($TiO_2$), which corresponds to a mobility of $4 \times 10^{-5}$ $cm^2/Vs$ based on Einstein's relation. These metrics indicate that lithium is up to 40,000-times faster than silver, making it ideal for a universal, low-voltage, fast, atomically-dense, nonvolatile memory that is compatible with low-voltage steep transistors such as the disclosed single-transistor RAM cell.

To control the position of the lithium ions 148 shown in FIG. 2, the back gate 146 is polarized to cause ion movement in the ion conductor 150 interposed between the channel 108 and the back gate 146. When a positive voltage is applied from a source to the write line 106 of FIG. 1 and thus to the back gate 146, the positive lithium ions 148 are directed towards the channel 108 by the electric field emanating from the back gate 146. The positive lithium ions 148 induce electrons from the source associated with the bit line 102 of FIG. 1 into the transistor channel 108 without exchanging electrons, that is, oxidizing or reducing. This behavior is possible in 2D crystals due to the absence of dangling bonds. In some examples, the lithium ions 148 work in conjunction with the first gate 112, thereby accelerating an amount of time it would otherwise take the first gate 112 to induce charge carriers into the channel 108. In other examples, drifting the ions 148 to the channel 108 is the primary reason that charge carriers are induced into the channel 108. Moreover, the close proximity of the ions 148 and induced charge carriers results in a Coulomb force that holds the ions 148 in place and provides non-volatility. In effect a capacitive double-layer is formed by drifting the ions 148 to the graphene channel 108.

The ions referred to in this disclosure and shown in the figures, such as the ions 148, are generally positive lithium ions. As those having ordinary skill in the art will understand, though, the positive lithium ions 148 are only used for explanatory purposes and are non-limiting. In other examples, a voltage applied to the write line 106 may cause negative ions to drift to the graphene channel 108. Thus as disclosed above, negative ions may also be utilized in a design in which holes are used as the charge carriers that enter the channel 108. Therefore, it may be generally said that ions drifted to the graphene channel 108 of the transistor induce charge carriers into the graphene channel 108. In still other words, the disclosed single-transistor RAM cell may be an N-channel device or a P-channel device.

Figure 3:
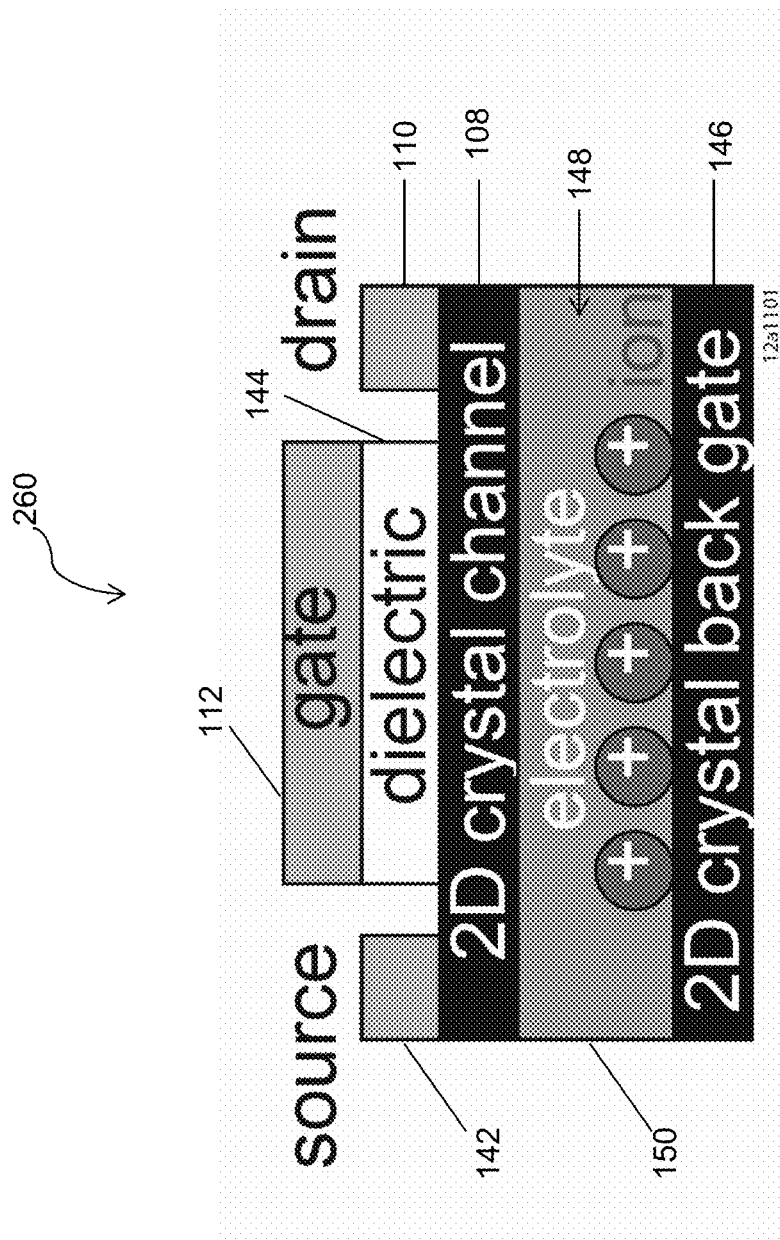
FIG. 3 is another cross-sectional schematic diagram of the example single-transistor RAM cell in the OFF state.

To erase the state of the memory, the write line 106 is used to pull the positive lithium ions 148 back from the 2D crystal, as shown in an example single-transistor RAM cell 260 of FIG. 3. Depending on the thickness of the ion conductor and effective velocity of the positive lithium ions 148, the speed of the single-transistor RAM cell for reading and writing is in the nanosecond range.

Figure 4:
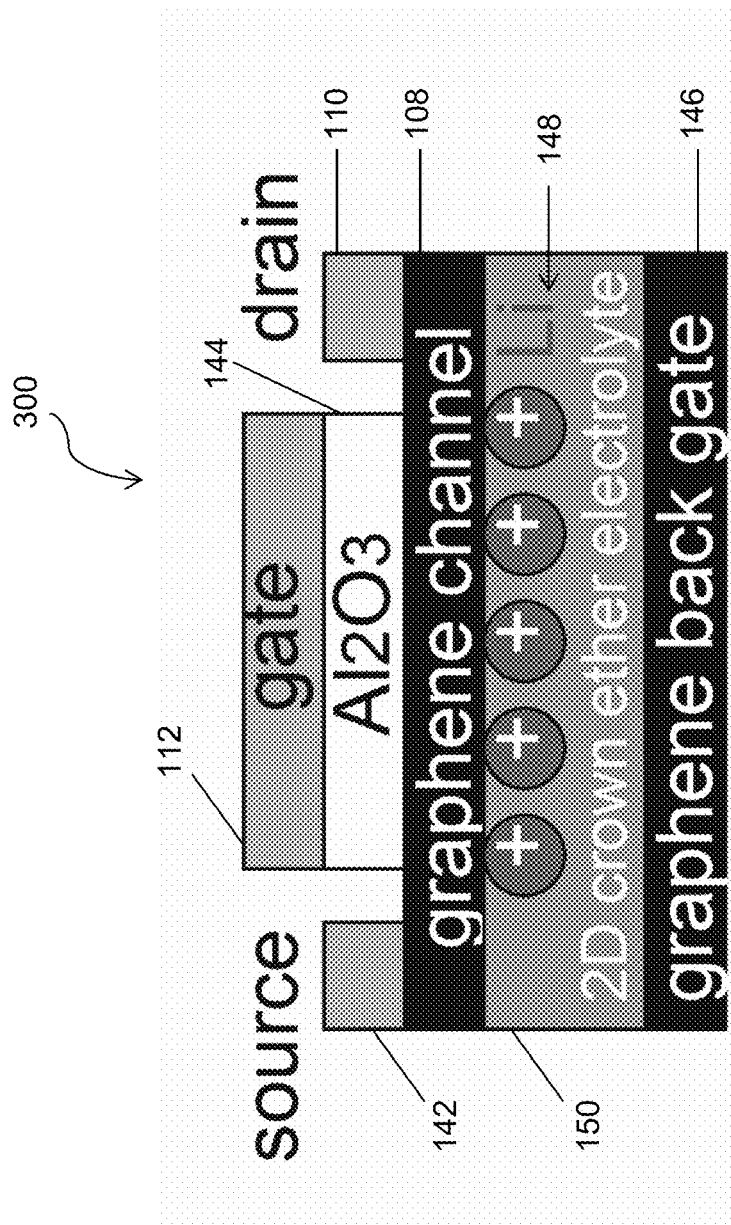
FIG. 4 is another example cross-sectional schematic diagram of the example single-transistor RAM cell in the ON state, with the example dielectric comprising an aluminum oxide and the example electrolyte comprising a two-dimensional crown ether.

As shown in FIG. 4 and as disclosed above, the ion conductor 150 of another example single-transistor RAM cell 300 may in some examples be formed of a solid polymer electrolyte that can easily be cast into thin films for small-scale applications. In the example shown in FIG. 4, the example ion conductor 150 is formed of a 2D crown ether electrolyte that has high ionic conductivity and low electronic conductivity. As with FIG. 3, the write line 106 of the single-transistor RAM cell 300 of FIG. 4 can be used to pull the positive lithium ions 148 back from the 2D crystal.

Those having ordinary skill in the art will appreciate that the present disclosure is not limited to the example single-transistor RAM cells shown in the figures, but contemplates variations that in some instances provide for a more compact design of atomic proportions, a higher speed of operation, and/or a simplification of fabrication requirements. For example, a highly-compact array of memory cells may be formed from a plurality of the example single-transistor RAM cells. By way of further example, a single-transistor RAM cell similar to that shown in FIGS. 2-4 may in some cases include an interlayer or other electrostatic feature (not shown) that acts as a barrier to ion transport between the back gate 146 and the channel 108. An electric field applied from the back gate 146 draws the ions 148 "through" the interlayer acting as the electrostatic barrier and adjacent to the channel 108. When the electric field is turned off, the ions 148 are locked into place in an interfacial layer between the interlayer and the channel 108. As disclosed above, one example way to erase the state of the single-transistor RAM cell is by applying an electric field from the back gate 146 to pull the ions 148 back from the 2D crystal channel 108. In response, the ions 148 will be returned to a position locked "between" the interlayer and the back gate 146. In addition to the example benefits disclosed above, the example interlayer may in some examples help prevent leakage of ions 148 from the graphene channel 108 back to the back gate 146.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

We claim:

1. A single-transistor random access memory (RAM) cell comprising:
    a conductive path that transmits charge carriers from a source;
    a drain for receiving at least some of the charge carriers;
    a channel comprising a two-dimensional (2D) crystal the channel interposed between the source and the drain, wherein the charge carriers flow along the conductive path, through the channel, to the drain;
    a first gate for electrically regulating the flow of the charge carriers through the channel;
    a dielectric isolating the first gate from the channel;
    an electrically-insulating ion conductor interposed between the channel and a back gate, the conductor comprising a plurality of ions, which are mobile within the conductor;
    the back gate for selectively positioning the plurality of ions adjacent to the channel by creating an electric field that directs the plurality of ions, wherein the plurality of ions, when positioned adjacent to the channel, induce the charge carriers into the channel, and wherein Coulomb forces between the charge carriers in the channel and the plurality of ions positioned adjacent to the channel hold the plurality of ions adjacent to the channel.

2. A single-transistor RAM cell of claim 1, wherein the charge carriers are electrons or holes, wherein the plurality of ions are cations, anions, or a mixture of cations and anions.

3. A single-transistor RAM cell of claim 1, wherein the channel comprises at least one of a transition metal dichalcogenide, graphene, or a graphene nanoribbon.

4. A single transistor RAM cell of claim 1, wherein the electrically-insulating ion conductor comprises a solid polymer electrolyte.

5. A single-transistor RAM cell of claim 1, wherein the electrically-insulating ion conductor comprises a crown ether electrolyte.

6. A single-transistor random access memory (RAM) cell comprising:
    a conductive path that transmits charge carriers from a source;
    a drain for receiving at least some of the charge carriers;
    a channel comprising a two-dimensional (2D) crystal interposed between the source and the drain, wherein the charge carriers flow along the conductive path, through the channel, to the drain;
    an electrically-insulating ion conductor interposed between the channel and a back gate, the ion conductor comprising a plurality of ions; and
    the back gate for selectively positioning the plurality of ions adjacent to the channel, wherein the plurality of ions positioned adjacent to the channel induce the charge carriers into the channel.

7. A single-transistor RAM cell of claim 6, further comprising:
    a first gate for electrically regulating the flow of the charge carriers through the channel; and
    a dielectric isolating the first gate from the 2D channel.

8. A single-transistor RAM cell of claim 7, wherein Coulomb forces between the charge carriers in the channel and the plurality of ions positioned adjacent to the channel hold the plurality of ions adjacent to the channel.

9. A single-transistor RAM cell of claim 7, wherein the charge carriers are electrons or holes, wherein the plurality of ions are cations or anions.

10. A single-transistor RAM cell of claim 7, wherein the charge carriers are electrons or holes, wherein the plurality of ions are introduced as a salt with both cations and anions.

11. A memory cell array comprising a plurality of the single-transistor RAM cells of claim 7.

12. A single-transistor RAM cell of claim 7, wherein the 2D crystal comprises graphene.

13. A single-transistor RAM cell of claim 7, wherein the channel comprises a graphene nanoribbon.

14. A single-transistor RAM cell of claim 7, wherein the channel comprises a transition metal dichalcogenide.

15. A single transistor RAM cell of claim 7, wherein the electrically-insulating ion conductor comprises a solid polymer electrolyte.

16. A single-transistor RAM cell of claim 7, wherein the electrically-insulating ion conductor comprises a crown ether electrolyte.

17. A single-transistor RAM cell of claim 7, wherein the dielectric comprises aluminum oxide.

18. A memory cell comprising:
    a transistor having at least a conductive path for transmitting charge carriers, the conductive path extending from a voltage source, through a channel, to a drain, wherein the channel comprises two-dimensional (2D) graphene and is disposed between the voltage source and the drain, wherein the transistor further comprises a first gate that regulates flow of the charge carriers from the voltage source into the channel;
    a dielectric isolating the first gate from the 2D graphene channel; and
    a back gate that selectively drifts a plurality of ions disposed in an electrically-insulating ion conductor interposed between the channel and a back gate towards or away from the channel by creating an electric field, wherein drifting the plurality of ions towards the channel reduces a resistance of the channel, wherein a state of the memory cell depends on the resistance of the channel.

19. A memory cell of claim 18, wherein Coulomb forces between the charge carriers in the channel and the plurality of ions positioned adjacent to the channel hold the plurality of ions adjacent to the channel.

20. A memory cell of claim 18, further comprising an electrically-insulating ion conductor interposed between the channel and the back gate, the electrically-insulating ion conductor comprises a crown ether electrolyte.

* * * * *